United States Patent [19]

Johnston, Jr. et al.

[11] Patent Number: 4,660,208

[45] Date of Patent: Apr. 21, 1987

[54] SEMICONDUCTOR DEVICES EMPLOYING FE-DOPED MOCVD INP-BASED LAYER FOR CURRENT CONFINEMENT

[75] Inventors: Wilbur D. Johnston, Jr., Mendham; Judith A. Long, Millburn; Daniel P. Wilt, Scotch Plains, all of N.J.

[73] Assignee: American Telephone and Telegraph Company, AT&T Bell Laboratories, both of Murray Hill, N.J.

[21] Appl. No.: 621,071

[22] Filed: Jun. 15, 1984

[51] Int. Cl.$^4$ .............................................. H01S 3/19
[52] U.S. Cl. ................................... 372/46; 29/569 L; 29/576 E; 148/1.5; 148/175; 357/16; 357/17
[58] Field of Search .................. 372/44, 45, 46, 48; 357/17, 16; 29/569 R, 569 L, 576 E; 148/175, 1.5

[56] References Cited

U.S. PATENT DOCUMENTS 4,193,335  3/1980  Inoue et al. ...................... 156/606

OTHER PUBLICATIONS

"Channeled Substrate Buried Heterostructure InGaAsP/InP Laser Employing a Buried Fe Ion Implant for Current Confinement", *Appl. Phys. Lett.*, vol. 44, No. 3, pp.-290-292, Feb. 1984, D. P. Wilt et al.
"InGaAsP Double-Channel-Planar-Buried-Heterostructure Laser Diode (DC-PBH-LD) with Effective Current Confinement", *Journal of Lightwave Technology*, vol. LT-1, No. 1, Mar. 1983, pp. 195-202, I. Mito et al.

*Primary Examiner*—James W. Davie
*Attorney, Agent, or Firm*—Michael J. Urbano

[57] ABSTRACT

High resistivity Fe-doped InP-based MOCVD layers are used to constrain current to flow through the active region of a variety of devices such as CSBH and DCPBH lasers.

12 Claims, 3 Drawing Figures

SEMICONDUCTOR DEVICES EMPLOYING FE-DOPED MOCVD INP-BASED LAYER FOR CURRENT CONFINEMENT

CROSS-REFERENCE TO RELATED APPLICATION

This application is being concurrently filed with application Ser. No. 621,080, now U.S. Pat. No. 4,595,454, entitled "The Fabrication of Grooved Semiconductor Devices" by W. C. Dautremont-Smith and D. P. Wilt.

BACKGROUND OF THE INVENTION

This invention relates to semiconductor devices and, more particularly; to buried heterostructure semiconductor light emitting devices such as lasers and LEDs.

A common problem in the fabrication of low threshold buried heterostructure (BH) lasers in the InGaAsP/InP materials system is the control of leakage currents (i.e., currents which bypass the active region of the device). These currents lead to high lasing threshold, low differential quantum efficiency, abnormal temperature dependence of threshold current, and rollover of the light-current (L-I) characteristic. All of these factors have a significant negative impact on the use of BH lasers in transmitters for fiber optic communication systems.

One possible solution to the problem of leakage current in buried heterostructure lasers is the controlled introduction of high resistivity material into the device structure. This high resistivity material could be used to block current flow through undesired leakage paths. Previously, high resistivity liquid phase epitaxial (LPE) $Al_{0.65}Ga_{0.35}As$ (lightly Ge-doped) material has been utilized for current confinement in AlGaAs/GaAs buried heterostructure lasers, but subsequent attempts to produce high resistivity LPE InP material for this purpose have not been successful. Deuteron bombardment has also been shown to produce highly resistive material from p-type InP, but this material is not expected to remain highly resistive during subsequent processing. In particular, because the high resistivity is related to deuteron implant damage, the resistivity anneals out at the high temperatures (e.g, above about 600° C.) required for subsequent LPE growth.

In addition, bifurcated, reverse-biased p-n junctions have also been reported for constraining current to flow through the active region of InGaAsP/InP lasers. These blocking junctions have been fabricated by the implantation of Be with n-InP substrates, by the diffusion of Cd into n-InP substrates, and by the epitaxial growth of a p-InP layer onto an n-InP substrate. But, all of these devices are impaired to some extent by leakage currents because of the imperfect blocking characteristics of the reverse-biased junctions.

More recently, D. P. Wilt et al. reported in *Applied Physics Letters,* Vol. 44, No. 3, p. 290 (Feb. 1984) that InP/InGaAsP CSBH lasers with relatively low leakage currents and low lasing thresholds can be fabricated by incorporating into the structure a high resistivity Fe-ion-implanted layer which constrains pumping current to flow through the active region. The high resistivity layer is produced by an Fe-ion implant into an n-type InP substrate followed by an annealing treatment prior to LPE growth. This laser is also the subject of copending application Ser. No. 549,160 filed on Nov. 8, 1983 by R. J. Nelson et al. Although the resistivity of the Fe-ion-implanted layer is stable even after being subjected to the high temperatures characteristic of LPE growth, the thinness of the Fe-implanted layer (about 0.4 μm) renders it difficult to reproducibly position the thin active layer (about 0.1–0.2 μm thick) adjacent thereto. When the active layer is not so placed, shunt paths are created which allow leakage current to flow around the active layer. Hence, high performance (low threshold, high efficiency) devices are hard to fabricate reproducibly.

SUMMARY OF THE INVENTION

We have found that reproducible BH lasers with low leakage currents, low lasing thresholds, excellent high frequency response and good reliability can be fabricated by incorporating into the structure a relatively thick, high resistivity Fe-doped InP-based layer grown by metallo-organic chemical vapor deposition (MOCVD) using either a ferrocene-based or iron pentacarbonyl-based dopant precursor. Importantly, InP:Fe layers which are relatively thick (e.g., 1–4 μm) and highly resistive (e.g., $10^3$–$10^9$ Ω-cm) are realized by this process, characteristics which are crucial to reducing leakage currents and increasing yields in a variety of devices.

For example, InP/InGaAsP CSBH lasers with pulsed threshold currents as low as 11 mA at room temperature (23° C.) have been achieved in accordance with our invention. These devices also had excellent high frequency performance as evidenced by a small signal bandwidth exceeding 2.4 GHz and modulation rates as high as 2.0 Gb/s.

In a similar fashion, InP:Fe MOCVD layers may be utilized as the current-blocking layers of a double channel planar buried heterostructure laser (DC-PBH) as discussed hereinafter.

In addition, the invention is also suitable for use in LEDs, photodiodes, and other InP devices in which current is constrained to flow in a channel through the active region of the device.

BRIEF DESCRIPTION OF THE DRAWING

Our invention, together with its various features and advantages, can be readily understood from the following, more detailed description taken in conjunction with the accompanying drawing, in which, in the interests of clarity, the figures have not been drawn to scale.

DETAILED DESCRIPTION

Figure 1:
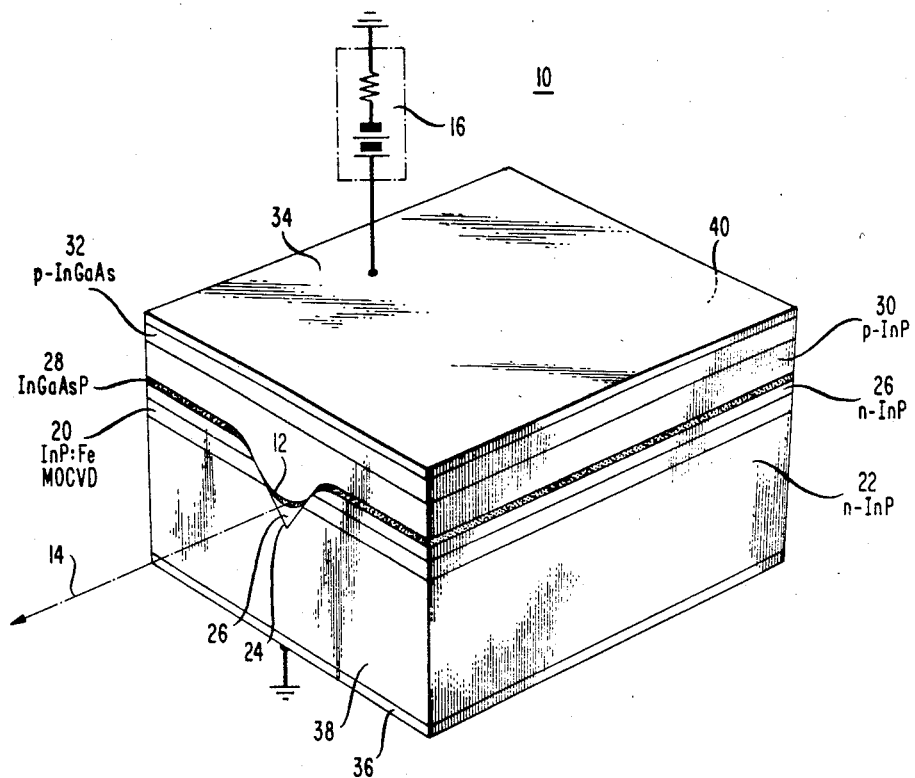
FIG. 1 is an isometric view of a CSBH light emitting device in accordance with one embodiment of our invention.

The semiconductor light emitting device shown in FIG. 1 may be used as a laser or as an edge-emitting LED. In either case, the device 10 includes an active region 12 in which the recombination of electrons and holes causes radiation to be emitted at a wavelength characteristic of the bandgap of the semiconductor material of the active region (e.g., about 1.0–1.65 μm for InGaAsP depending on the specific composition of the alloy). The radiation is directed generally along axis 14 and is primarilly stimulated emission in the case of a laser and primarily spontaneous emission in the case of an LED.

This recombination radiation is generated by forward-biasing a p-n junction which causes minority carriers to be injected into the active region. Source 16, illustratively depicted as a battery in series with a current-limiting resistor, supplies the forward bias voltage and, in addition, provides pumping current at a level commensurate with the desired optical output power. In a laser, the pumping current exceeds the lasing current threshold.

In general, the device includes means for constraining the pumping current to flow in a relatively narrow channel through the active region 12. As illustrated, this constraining means comprises a bifurcated, high resistivity Fe-doped MOCVD InP layer 20, and the active region 12 has the shape of a stripe which lies in the rectangular opening of the bifurcated layer 20. Note, in the case of a surface emitting LED the layer 20, rather than being bifurcated, might take the shape of an annulus surrounding a cylindrical or mesa-like active region.

The structure shown in FIG. 1 is known as a channeled-substrate buried heterostructure (CSBH) laser which includes an n-InP substrate 22 and an Fe-doped MOCVD, high resistivity InP layer 20 which is bifurcated by a groove 24. The groove is etched or otherwise formed through layer 20 into substrate 22. A preferred technique for controllably etching the groove in the shape of a V is described in copending, concurrently filed application of W. C. Dautremont-Smith and D. P. Wilt, supra. That application is incorporated herein by reference.

Briefly, this etching technique entails the use of a composite etch mask comprising a thin (e.g., 18–22 Å) native oxide layer formed on a (100)-oriented InP surface and a $SiO_2$ layer plasma deposited on the native oxide. The native oxide layer may be grown using plasma enhanced or thermal methods. The mask is patterned using standard photolithography and plasma etching so that the mask openings ($\lesssim$2.2 μm wide) are parallel to the [011] direction. V-grooves that are 3.0 μm deep with only (111) B-oriented sidewalls are formed by room temperature etching in HCl-rich etchants such as 3:1 $HCl:H_3PO_4$.

The following essentially lattice-matched epitaxial layers are then grown by LPE on the etched wafer: an n-InP first cladding layer 26 (the central portion of which fills at least the bottom portion of groove 24); an unintentionally doped InGaAsP layer 28; a p-InP second cladding layer 30; and a p-InGaAs (or p-InGaAsP) contact-facilitating layer 33. Layer 28 includes crescent-shaped active region 12 which, in practice, becomes separated from the remainder of layer 28 because epitaxial growth does not take place along the top edges of the groove 24. Provided that nonradiative recombination at the interface with high resistivity layer 20 is not significant, the active layer is preferably vertically positioned within the thickness of the high resistivity layer 20 in order to reduce leakage current. However, if the active layer is below layer 20, but near enough thereto (i.e., $\lesssim$1 μm away), leakage currents are still significantly reduced and nonradiative recombination at the layer 20 interface becomes much less of a problem.

Although the high resistivity InP:Fe layer 20 is formed directly on the substrate 22, it may also be formed on an epitaxial buffer layer (not shown) grown on the substrate. In either case, we have found that high resistivity of layer 20 is best achieved by the MOCVD process described by W. D. Johnston, Jr. and J. A. Long is copending applications Ser. Nos. 544,215 and 604,370 filed on Oct. 21, 1983 and Apr. 26 1984, respectively, both of which are entitled "Semi-Insulating Indium Phosphide Based Compositions" and both of which are incorporated herein by reference. Both of these applications have been abandoned in favor of continuation application Ser. No. 831,113 filed on Feb. 20, 1986, which is also incorporated herein by reference.

Briefly, this MOCVD process involves the use of a ferrocene-based or iron pentacarbonyl-based dopant precursor (or a combination of such precursors) in conjunction with an indium-organic material such as an indium alkyl. Advantageously, an adduct is formed first between the indium-organic and an alkyl phosphine. The adduct is introduced into the gas stream by a flowing gas (e.g., hydrogen or an inert gas) through a bubbler containing it. A source of phosphorus (e.g., phosphine) is also introduced into the gas flow. The dopant precursor is introduced to yield a mole ratio of iron to indium in the gas stream in the range $1.2\times10^{-4}$ to $1\times10^{-5}$.

Relatively thick (e.g., 1–4 μm) InP:Fe layers with resistivities as high as $1\times10^9$ Ω-cm are achievable by this process which is also applicable to other InP-based compositions (e.g., InGaP, InAsP, InGaAsP, InGaAlP). For CSBH InP/InGaAsP lasers, however, a resistivity in excess of about $1\times10^6$ Ω-cm is desirable.

A high resistivity layer so prepared maintains its high resistivity even after being subjected to the high temperatures of subsequent LPE process steps.

Electrical contact is made to the device via metal electrodes 34 and 36 on layer 32 and substrate 22, respectively. Source 16 is connected across electrodes 34 and 36.

Figure 2:
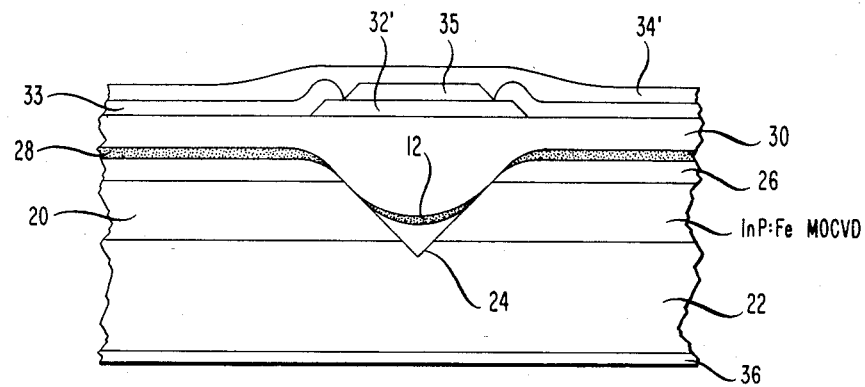
FIG. 2 is an end view of another embodiment of a CSBH device in accordance with our invention.

Although a broad-area contact is depicted in FIG. 1 by layer 32 and electrode 34, it also is possible to delineate a stripe geometry contact as shown in FIG. 2. Here components with primed notation in FIG. 2 correspond to those with the same reference numerals in FIG. 1. Thus, the contact-facilitating layer 32' is etched to form a stripe and is aligned within the stripe-shaped opening of $SiO_2$ layer 33. A stripe-shaped metal contact 35 is formed on layer 32' in the opening of $SiO_2$ layer 33, and a broad area electrode 34' is then formed over the top of the device. A contact configuration of this type reduces device capacitance and hence increases high speed performance.

The CSBH laser also includes means for providing optical feedback of the stimulated emission, typically a pair of separated, parallel, cleaved facets 38 and 40 which form an optical cavity resonator as shown in FIG. 1. The optical axis of the resonator and the elongated direction of the stripe-shaped active region 12 are generally parallel to one another. Other feedback techniques are also suitable, however, including well-known distributed feedback gratings, for example.

EXAMPLE

The following example describes the fabrication of an InP/InGaAsP CSBH laser in accordance with one embodiment of our invention. Unless otherwise stated, various materials, dimensions, concentrations, operating parameters, etc., are given by way of illustration only and are not intended to limit the scope of the invention.

In this example we demonstrate for the first time the utilization of a high resistivity, Fe-doped InP layer grown by MOCVD as the base structure for a In- GaAsP/InP CSBH laser. A pulsed threshold current as low as 11, mA, and pulsed light output at 100 mA current as high as 14 mW has been achieved for this structure, with good yield and uniformity of devices. The superior high frequency response expected for a device with a semi-insulating base structure has been verified, with small signal bandwidths exceeding 2.4 GHz. In addition, modulation at rates as high as 2.0 Gb/s has been achieved.

The CSBH lasers, of the type shown in FIG. 2, were fabricated as follows. Using the MOCVD epitaxial reactor described in the copending applications of W. D. Johnston, Jr. and J. A. Long, supra, a single layer 20 of Fe-doped InP was grown on an n-type InP substrate 22 (S-doped LEC material) nominally oriented along the (100) plane (no intentional misorientation was employed).

The Fe-doped layer was between 1 and 4 $\mu$m thick and had a resistivity of at least $1 \times 10^6$ $\Omega$-cm. Then a composite native oxide/$SiO_2$ etching mask was deposited as described in the concurrently filed application Ser. No. 621,080, now U.S. Pat. No. 4,595,454, of W. C. Dautremont-Smith and D. P. Wilt, supra. The mask was patterned into 2.0 $\mu$m wide windows, and the V-groove 24 for subsequent LPE growth was etched in a mixture of 3:1 $HCl:H_3PO_4$. The mask was then stripped in HF, and the wafer was loaded into a LPE reactor. Prior to the LPE growth, the wafer was protected in an external chamber containing a saturated Sn-In-P solution as described by P. R. Besomi et al. in copending, allowed patent application Ser. No. 392,065, now U.S. Pat. No. 4,482,423 filed on June 25, 1982, which is incorporated herein by reference. The DH (layers 26, 28 and 30) was then grown by LPE at approximately 630° C. These layers included an n-type InP (Sn-doped) layer 26, a nominally undoped InGaAsP ($\lambda_g \approx 1.3$ $\mu$m) layer 28, and a p-type InP (Zn-doped) layer 30. On the DH a contact-facilitating p-type InGaAsP ($\lambda_g \approx 1.2$ $\mu$m, Zn-doped) layer was grown and later etched as described below. The width and thickness of the crescent-shaped active region 12 were typically 2.5 $\mu$m and 0.2 $\mu$m, respectively. Care was taken to grow the active region in the channel and within the thickness of the high resistivity layer 20 in order to reduce leakage current and shunt capacitance. However, even when the active layer was below layer 20, but within about 1 $\mu$m of it, the laser performance exceeded that of prior designs (i.e., either those with Cd-diffused base structures or Fe-ion implanted base structures).

After the LPE growth was completed, standard channeled substrate buried heterostructure laser processing was performed. First, $SiO_2$ was deposited over the surface of the wafer and patterned into stripes directly over the buried active regions, with the alignment performed by etching of the wafer edges to reveal the buried structure. The contact facilitating layer of the structure was then etched in 10:1:1 ($H_2SO_4:H_2O_2:H_2O$) to leave InGaAsP stripes 32' as shown in FIG. 2, and the $SiO_2$ etch mask was stripped in HF. Another $SiO_2$ layer 33 was then deposited and patterned to form windows over the stripes of layer 32'. The photoresist used in patterning the $SiO_2$ layer 33 was then used as a liftoff mask for an evaporated AuZnAu contact 35. After alloying the AuZnAu contact 35, the wafer (substrate) was lapped and a back (n-side) contact pad of AuGe was deposited and alloyed, using a similar liftoff technique. A front (p-side) TiPt overlay metallization (not shown) was deposited and sintered, and both front and back sides of the wafer were plated with Au layers 34' and 36 to serve as contacts and as bonding pads. Finally, the wafer was scribed and cleaved into individual chips 250 $\mu$m long by 500 $\mu$m wide.

The pulsed light-current (L-I) and dL/DI characteristics of the lasers were measured. One laser had a threshold current at 30° C. of 21 mA and achieved 10 mW of output power at a current of 85 mA. The light output at 100 mA was 11.8 mW. The peak slope efficiency was 0.18 mW/mA, equal to our best results on other lasers with good current confinement. The peak efficiency was maintained well throughout this range, dropping slightly at the higher power levels, possibly due to current flow around the edges of the active region or current flow into regions of the active layer not responsible for stimulated emission (e.g., the "wings" of the crescent-shaped active region). The I(dV/dI) saturation for this device was measured to near ideal at threshold, indicative of good current confinement.

The good intra-wafer uniformity available for this type of device was illustrated by tight distributions in threshold current and light output at 100 mA under pulsed conditions. For a random sample of 25 unbonded devices from this wafer, the mean threshold current was 20.1 mA, the median threshold current was 19.2 mA, and the standard deviation of the distribution was 4.6 mA. THe mean light output at 100 mA was 9.93 mW, the median was 11.4 mW, and the standard deviation was 1.8 mW.

The burn-in characteristics of a group of lasers with this structure, under 60° C. and 3 mW automatic power control burn-in conditions, illustrated their good stability. The degradation rates measured on bonded, purged lasers were as low as 1 mA per thousand hours at the 60° C.-3 mW burn-in conditions. Purging is described by E. I. Gordon et al. in copending application Ser. No. 592,285 filed on Mar. 22, 1984, now U.S. Pat. No. 4,573,255. This degradation rate is low enough for these lasers to be used in optical communications systems.

The far field emission patterns were measured at 3 mW CW output power. The measured half power beamwidths were 17° and 28° parallel and perpendicular to the junction plane, respectively. An optical emission spectrum exhibited a few longitudinal modes centered at a wavelength of 1.2925 $\mu$m.

The modulation response of this laser was particularly good. Rise and fall times measured with a high speed driver were approximately 0.3 ns and high speed modulation was achieved at rates as high as 2 Gb/s with good eye patterns. The small signal response was plotted as a function of optical power output. The 3 dB cutoff frequency varied from 2.1 GHz at lasing threshold to a maximum of more than 2.4 GHz at 1 mW of optical power. Thereafter, this cutoff frequency fell to 2.0 GHz at 2 mW and 1.8 GHz at 3 mW.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, while our invention has been discussed with reference to lasers and LEDs, it will be appreciated by those skilled in the art that it is applicable to other semiconductor devices (e.g., photodiodes) in which current is constrained to flow in a channel through an active region.

Figure 3:
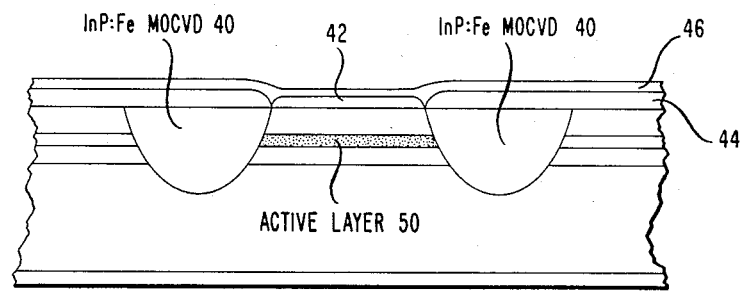
FIG. 3 is an end view of DC-PBH device in accordance with still another embodiment of our invention.

One alternative laser embodiment of our invention involves the double channel planar buried heterostructure (DCPBH). The conventional DCPBH laser is described generally by I. Mito et al. in *Journal of Lightwave Technology*, Vol. LT-1, No. 1, p. 195 (1983). It employs LPE regrowth in the channels to form reverse-biased blocking junctions which constrain current to flow through the elongated mesa containing the active layer. In accordance with the DCPBH embodiment of our invention shown in FIG. 3, however, the LPE regrowth of blocking junctions is replaced by MOCVD growth of InP:Fe zones 40 on each side of the mesa. A restricted (e.g., stripe geometry) contact 42 is delineated on top of the mesa by a patterned dielectric layer 44 (e.g., SiO$_2$) and an electrode 46 overlays the top of the device. In this fashion, current is constrained by the InP:Fe zones 40 and the dielectric layer 44 to flow essentially only through the mesa and hence through the active layer 50.

Finally, it is well known that the active region of the devices described above may include a single active layer or a composite of several layers at least one of which is active (in the light-emitting sense). Thus, in a 1.55 μm InP/InGaAsP laser, the active region may include an InGaAsP layer which emits light at 1.55 μm adjacent another InGaAsP layer (λ=1.3 μm) which serves an anti-meltback function during LPE growth. Moreover, several active layers emitting at different wavelengths are also embraced within the definition of an active region.

What is claimed is:

1. A semiconductor device comprising
   an active region,
   electrode means for applying current to said device, and
   means for constraining said current to flow in a channel through said active region,
   characterized in that
   said constraining means comprises a high resistivity Fe-doped MOCVD InP-based layer having an opening through which said channel extends.

2. A light emitting device comprising
   an InP body,
   a heterostructure including InP and InGaAsP layers and in a limited area thereof an active region which is responsive to pumping current to generate optical radiation,
   electrode means for applying said pumping current to said device, and
   means for constraining said pumping current to flow in a channel through said active region,
   characterized in that
   said constraining means comprises a high resistivity Fe-doped MOCVD InP-based layer formed on said body.

3. The device of claim 2 for use as a laser wherein said active region has the shape of an elongated stripe and including means forming an optical cavity resonator having its optical axis essentially parallel to the elongated direction of said stripe.

4. The device of claim 3 wherein the cross-section of said active region transverse to its elongated direction has the shape of a crescent.

5. The device of claim 4 wherein said Fe-doped MOCVD InP-based layer is bifurcated by an essentially rectangular opening in which said stripe-shaped active region lies.

6. The device of claim 5 wherein said opening is formed by a groove which extends through said Fe-doped MOCVD layer into said body, a portion of said heterostructure filling said groove and said stripe-shaped active region being situated in said groove and not more than about 1 μm below said Fe-doped layer.

7. The device of claim 6 wherein said active region lies within the thickness of said Fe-doped layer.

8. The device of claim 2, 3, 4, 5, 6 or 7 wherein said Fe-doped MOCVD layer is epitaxially grown using a dopant precursor selected from the group consisting of ferrocene-based and iron pentacarbonyl-based compositions and a deposition gas produced by combining entities including an organo-indium compound and a source of phosphorus.

9. The device of claim 8 wherein said Fe-doped layer comprises InP and its resistivity exceeds approximately 10$^6$ Ω-cm.

10. A light emitting device comprising
    a heterostructure of InP and InGaAsP layers formed in the shape of an elongated mesa bounded on opposite sides by channels and including an active layer which is responsive to pumping current to generate optical radiation,
    electrode means for applying said pumping current to said device, and
    means within said channels for constraining pumping to flow through said mesa,
    characterized in that
    said constraining means comprises a high resistivity Fe-doped MOCVD InP-based layer formed in said channels.

11. The device of claim 10 wherein said Fe-doped MOCVD layer is epitaxially grown using a dopant precursor selected from the group consisting of ferrocene-based and iron pentacarbonyl-based compositions and a deposition gas produced by combining entities including an organo-indium compound and a source of phosphorus.

12. The device of claim 11 wherein the said Fe-doped layer compries InP and its resistivity exceeds approximately 10$^6$ Ω-cm.

* * * * *